United States Patent

Fischer et al.

[15] 3,678,301

[45] July 18, 1972

[54] LOGIC MODULE CONNECTED TO ACT AS FLIPFLOP

[72] Inventors: Gerd Fischer; Dieter Straub; Heinz Eberhard Voigt, all of Constance, Germany

[73] Assignee: Licentia Patent-Verwaltungs-G.m.b.H., Frankfurt am Main, Germany

[22] Filed: Feb. 19, 1971

[21] Appl. No.: 117,034

[30] Foreign Application Priority Data

Feb. 20, 1970 Germany ......................P 20 07 912.3

[52] U.S. Cl. ..............................................307/289, 307/290

[51] Int. Cl. .......................................H03k 3/26, H03k 3/286

[58] Field of Search ..................................307/289, 290, 235

[56] References Cited

UNITED STATES PATENTS 3,339,089 8/1967 Bergman...............................307/289

3,548,221 12/1970 Hintz ................................307/289 X 3,573,488 4/1971 Beelitz ..............................307/289 X

*Primary Examiner*—John Zazworsky

*Attorney*—Spencer & Kaye

[57] ABSTRACT

A flipflop circuit having a first pair of transistors having their bases connected to receive input signals and their collectors arranged to produce output signals, the transistors assuming respectively opposite switching states depending on the relative levels of the inputs thereto, a conductor connecting the collector of one transistor to one of the inputs of the other transistor for causing the transistors to remain in their existing switching states after the removal of input signals, and a second pair of transistors each having its base connected to the base of a respective transistor of the first pair and providing at their collectors the direct and complement output signals for the circuit. Means are provided to selectively place a conductive path across the emitter-collector of one transistor of the first pair, thereby to suppress the storage capability of the circuit.

3 Claims, 10 Drawing Figures

PATENTED JUL 18 1972 3,678,301

Inventors.
Gerd Fischer
Dieter Straub
Heinz Eberhard Voigt
BY Spencer & Kaye
ATTORNEYS

LOGIC MODULE CONNECTED TO ACT AS FLIPFLOP

BACKGROUND OF THE INVENTION

The present invention relates to a logic module which is connected to act as a flipflop, is designed according to the so-called SECL (symmetric emitter coupled logic)technique and is suited for use in integrated circuits. In a SECL circuit system, a pair of transistors are connected in current mode technique and their coupled emitters are fed by a constant current applying circuit while input signals are fed to their bases via emitter follower stages and the resulting output signal and its complement appear across their collector resistors. Such circuits are disclosed, for example, in U.S. Pat. No. 3,504,192 issued to Herbert Stopper on Mar. 31st, 1970.

The logic circuit diagram of such a circuit is shown in FIG. 1a. The input variables A1, A2 . . . are combined in a first OR linkage 1 and the input variables B1, B2 are combined in a second OR linkage 2. The output signal from the first OR linkage is combined with the negated output signal from the second OR linkage in a third OR linkage 3 which furnishes the output C and its complement $\overline{C}$. FIG. *1b* shows a simplified symbol for such a logic module with inputs A1, A2, B1, B2 and outputs C and $\overline{C}$.

The logic linkage between the outputs and the inputs is expressed by the following equations:

$C = A1 + A2 + \overline{B1} . \overline{B2}$ $\overline{C} = \overline{A1} . \overline{A2} . (B1 + B2)$ where "+" indicates the disjunctive operation, or OR function, and "." the conjunctive operation, or AND function. i.e.

A paper by Straub and Wolf, entitled "Ein Mehrfunktionen-Baustein als Gatter und MN-Flipflop" [A multiple function module as gate and MN flipflop] published in "Wissenshcaftliche Berichte" [Scientific Reports] AEG-TELEFUNKEN 41 (1968) 1, pages 39–43, describes how such a logic circuit can be operated as a flipflop i.e. a circuit which stores the result signal beyond the effective period of the input signals, by connecting the negated output $\overline{C}$ to one of the B inputs B2, as shown in FIG. *2a*. When only one A input is used, the following defines the relationship of the input values M = A1 and N – B2 with the output values $Q_n = C$ and $\overline{Q_n} = \overline{C}$ after the input signals have been applied to the input terminals $Q_n = M + \overline{N} . Q_{n-1}$ $\overline{Q_n} = M . (N + \overline{Q_{n-1}})$ where $Q_{n-1}$, $Q_{n-1}$ are the previously stored switching state and its complement, $Q_n$, $Q_n$ the resulting switching state and its complement.

The truth table of this function is:

| M N $Q_n$ | $\overline{Q_n}$ |
|---|---|
| O O $Q_{n-1}$ | $\overline{Q_{n-1}}$ |
| O L O | L |
| L O L | O |
| L L L | O |

Thus whereas in the known RS flipflop the application of positive signals simultaneously to the two inputs R and S is not permitted, the MN flipflop discussed here unambiguously produces the result Q = L when both input terminals are supplied with a signal representing L. Since this result coincides with that obtained when only input terminal M receives such a signal, M is considered to be the preferred input terminal.

Because the output terminal $\overline{Q}$ is conductively connected to an input terminal, it cannot be loaded with a low resistance without the occurrence of interfering effects. This terminal can thus not be used as the output terminal for coupling to a further switching circuit. Particular difficulties arise when the output $\overline{Q}$ is to be connected to a load over a transmission line whose delay time is comparable with the rise time of the signal at the output of the SECL module.

The SECL logic module furnishes output pulses having such steep edges that the connection between individual modules must be in the form of lines having a defined impedance. The modules are preferably so designed that the lines are operated as lines which are terminated at the input end and have no load at the output end. If such a line has a characteristic impedance $Z_0$ and at the input end initially a terminating impedance $R = Z_0$, the pulse shapes illustrated in FIGS. *3a* and *3b* appear at the input and output ends, respectively, of the line.

At the input end of the line, as shown in FIG. *3a*, there first appears a pulse with a one-half signal amplitude which moves along the line and is reflected at the output end of the line with a positive polarity sign to then return over the line. At the input end of the line the full signal amplitude is thus present only after twice the delay time $t\Delta$ of the pulses in the line. FIG. *3b* shows the signal waveform at the output end of the line.

In a flipflop this reflection characteristic effectuates the storage, i.e., when the output signal is present at an input of the flipflop the flipflop can retain its information by itself and the external input signal can be removed. If a line is connected to the flipflop output $\overline{Q}$, the pulse duration of the input signal must be adapted to the length of the line. Since this is very difficult in practice, and can moreover easily lead to design errors, a load on this output must not be permitted as soon as the required line exceeds a given length. This is remedied in a known manner by connecting the flipflop to a further circuit contained in the same module. This measure, however, leads to a doubling of the signal delay time since the signal must then pass through two consecutive emitter-coupled switches. The operating speed of the circuit system is thus reduced.

SUMMARY OF THE INVENTION

It is a primary object of the present invention to overcome the above-noted drawbacks and difficulties.

Another object of the invention is to avoid reductions in the operating speed of flipflops constructed from units of the type described above.

A further object of the invention is to provide a flipflop having a selectively suppressible memory capability.

Basically, the above objects are achieved by the provision of a logic circuit including a first pair of transistors connected in current mode technique and having their emitters coupled to be fed by a constant current source, input signals being fed to their bases via emitter follower stages and the output signal and its complement appearing across their collector resistors, a circuit connection being provided for storing the output signal beyond the period of effectiveness of the input signals, this circuit connection being disposed between the collector of the transistor furnishing the complement of the output signal and an input emitter follower stage associated with the other transistor.

According to the present invention a further pair of transistors is provided in current mode technique with their emitters coupled to be fed by a further constant current source and their bases connected with the corresponding bases of the first pair of transistors, the resulting output signal and its complement appearing at the collector resistors of this second pair of transistors and serving as the output signals of the logic circuit.

Further according to the present invention it is possible with such a flipflop to eliminate the storage effect by connecting the emitter-collector path of that one of the first pair of transistors at which the complement of the resulting output signal appears in parallel with the emitter-collector path of a further transistor which, in order to suppress the storage capability of the circuit, can be placed in the conductive state by a suitable voltage applied to its base. It is here advantagesous to connect the output of an emitter-follower stage to the input of this further transistor and to apply a control signal to such stage so that the external control signal for this further transistor is at the same amplitude lever as the control signals for the other inputs of the logic circuit.

The desire for suppression of the store capability results from practical experience which reveals that sequential networks require a substantially greater degree of testing than logic networks. A logic network with n inputs and m outputs, each input and output variable having only two possible states, can be completely tested by applying thereto the possible number of combinations of the input variables and monitoring each output in turn. With *n* inputs this equals $2^n$ combinations. If the time required for testing one output is known (e.g. *x* seconds), the time required, $t_{test}$, for the entire testing of a logic network with n inputs and m outputs can be directly given as:

$t_{test} = 2^n \cdot m \cdot x$ sec

If a memory is included in the network, and the memory inputs are not also inputs for the network, the testing time can no longer be estimated in such a simple manner. A higher number of input combinations is necessary. Since, in practice more than one memory will be contained in a sequential network, the testing time required further increases.

Since the present invention makes it possible, however, to now construct a memory element in which the storage capability can be suppressed, it is possible, for testing purposes, to treat a sequential network as a logic network and thus to substantially reduce the testing time.

BRIEF DESCRIPTION OF THE DRAWINGS

FIGS. 1–3 have already been described in detail above.

DESCRIPTION OF THE PREFERRED EMBODIMENTS

Figure 1A:
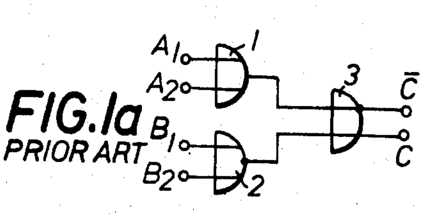
FIG. 1a PRIOR ART
FIG. 1*a* is a logic diagram of a prior art flipflop.
Figure 1B:
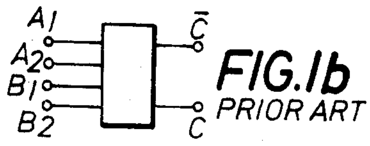
FIG. 1b PRIOR ART
FIG. 1*b* is a block symbol representing the circuit of FIG. 1*a*.
Figure 2A:
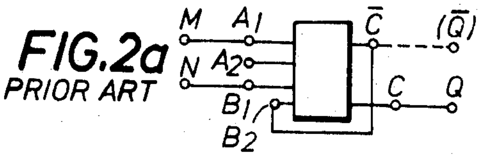
FIG. 2a PRIOR ART
FIG. 2*a* is a logic diagram of a modified flipflop according to the prior art.
Figure 2B:
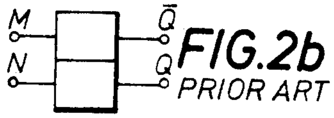
FIG. 2b PRIOR ART
FIG. 2*b* is a block symbol representing the circuit of FIG. 2*a*.
Figure 3A:
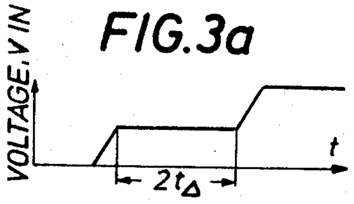
FIGS. 3*a* and 3*b* are voltage waveforms of the signal at the input and output ends, respectively, of a storage transmission line used in the circuit of FIGS. 2*a* and 2*b*.
Figure 3B:
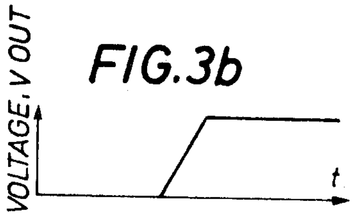
Figure 4:
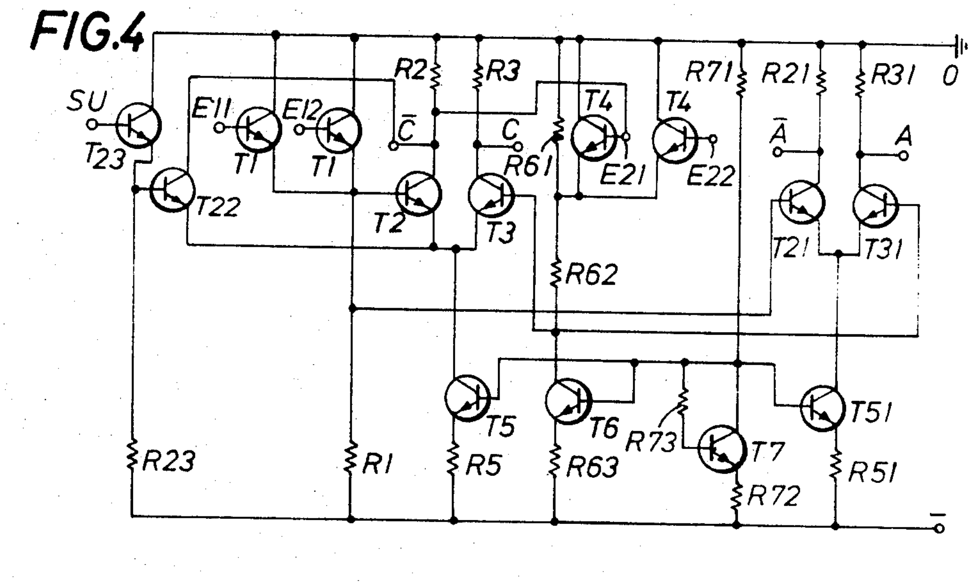
FIG. 4 is a schematic diagram of a preferred embodiment of the invention.

FIG. 4 shows one embodiment of the present invention constituted by a flipflop whose two output terminals can be loaded in any desired manner and whose storage capability can be eliminated by the application of a special control signal.

A first pair of transistors T2 and T3 in current mode technique and having coupled emitters forms a first switch and is fed with the negative battery voltage (−) at the emitters via a constant current circuit consisting of a transistor T5 connected in series with a resistor R5. The collectors of transistors T2 and T3 are connected to ground via collector resistors R2 and R3, respectively, the ground being connected to the positive battery terminal. The base of the first transistor T2 of the current-switch is fed, via emitter followers consisting of transistors T1 having parallel-connected emitter-collector paths and a common emitter resistor R1, with the input signals E11 and E12 each applied to the base of a respective one of transistors T1.

The base of the second transistor T3 of the current switch is connected in a known manner, as disclosed in the above-cited U.S. patent, with emitter followers consisting of transistors T4 having parallel-connected emitter collector paths and each having its base supplied with a respective one of the input signals E21 and E22.

A voltage reducing circuit, which contains the common emitter resistor R62 of emitter followers T4, consists of a series connection of resistors R61 and R62, a transistor T6 and its emitter resistor R63 and is connected between the battery voltage terminals. The bias for the bases of transistors T5 and T6 is taken in a known manner from the collector of a transistor T7 whose emitter-collector path is connected in series with two resistors R71 and R72 across the battery voltage, the base of the transistor T7 being connected to its collector via a resistor R73. This circuit applies a bias to the bases of the transistors T5 and T6, which serve as the constant current circuit, such that the temperature influence on the signal waveforms at terminals C and $\overline{C}$ is substantially compensated.

The part of the circuit which has been described is already known. By connecting the collector of transistor T2, where the complement $\overline{C}$ of the resulting output signal appears, to the input terminal E21 of one of the emitter followers T4 associated with transistor T3, there results in a known manner an MN flipflop whose preferred inputs (M) are constituted by inputs E11, E12, whereas the reset input (N) is constituted by input E22. Such a flipflop exhibits the behavior set out in the above description.

It should be noted that further transistors could be connected in parallel with transistors T1 as well as with transistors T4, the inputs of these transistors would be called E13, E14 . . . or E23, E24 . . . , respectively, and they would each form, together with the transistors shown in FIG. 4 a multiple OR circuit at the bases of transistors T2 and T3. In the following description, these OR inputs will be considered as a common input, leading to the following reference symbols:

E11 + E12 + E13 + . . . = E1

E22 + E23 . . . = E2

To produce, for the result signal and its complement, to outputs which are capable of being loaded, the circuit arrangement according to the present invention provides a further current switch in the form of transistors T21 and T31 each having its base connected to the base of a respective one of transistors T2 and T3. The constant current circuit for this second switch is formed of a transistor T51 whose collector feeds the coupled emitters of transistors T21 and T31, and an emitter resistor R51 and has the same electrical parameters as the constant current circuit T5, R5.

The base of transistor T51 is supplied from the same bias source, T7, R71, R72, R73, as the bases of transistors T5 and T6. The collector resistors R21 and R31 of transistors T21 and T31 have the same resistance value as resistors R2 and R3. The output terminals $\overline{A}$ and A which are connected to the collectors of transistors T21 and T31 always carry the same signal as the corresponding circuit terminals $\overline{C}$ and C if the effect of transistor T22, which will be described below, is disregarded. Terminal $\overline{A}$, unlike terminal $\overline{C}$, can be connected to a load and thus only terminals $\overline{A}$ and A are brought to the outside of the module to serve as its output terminals for connection to further circuits.

As will be appreciated from the above description, the circuit arrangement of FIG. 4 constitutes an MN flipflop which can be constructed according to the integrated circuit and SECL techniques and whose two output terminals can be connected to loads. The association of the input and output terminals is in this case as follows:

E1 = M

E2 = N

A = Q $\overline{A} = \overline{Q}$

As already mentioned above, it is possible with such a flipflop to cancel the memory effect by simple additional means so that the circuit becomes a simple logic member without any memory effect. For this purpose the emitter-collector path of transistor T2 of FIG. 4 is connected in parallel with the emitter-collector path of a further transistor T22 whose base is controlled by an emitter follower consisting of transistor T23 and emitter resistor R23. The base of the emitter follower T23 can be controlled with a binary signal SU which takes on the same voltage values as the voltages representing the binary logic values L and O at the other input and output terminals of the logic module.

As long as a voltage corresponding to a logic "0" is applied as signal SU, the circuit acts as a flipflop the state of the first switch T2, T3 as well as the state of the second switch T21, T31 depending on the input variables E1 and E2.

If signal SU assumes a voltage corresponding to logic "L," the first emitter-coupled switch T2, T3, which provides the storage effect of the circuit, is brought into a state where it can no longer be influenced by the other inputs, whereas the state of the second emitter-coupled switch T21, T31 remains dependent on the input signals. This can easily be appreciated if it is considered when transistor T22 is conducting it draws current from current source T5, R5 of the first switch and thus there is always a voltage drop across R2. The same effect can also be achieved by other means, for example a transistor with its own emitter resistor, however, the illustrated circuit for transistor T22 appears to be the simplest and most desirable.

Figure 5:
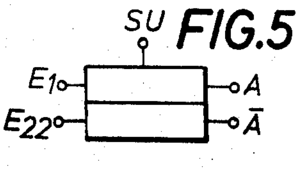
FIG. 5 is a block symbol representing the circuit of FIG. 4.

The equivalent circuit symbol for the novel module in an SECL circuit system as described in connection with FIG. 4 is shown in FIG. 5 to include input terminals E1 and E2 (E1 being the preferred input terminal) and output terminals A and $\overline{A}$. By controlling signal SU at the further switching terminal, the storage effect can be eliminated and the flipflop can thus be converted into a logic element without any storage effect.

The logic equations which describe this circuit module are:

$$A_n = E1 = \overline{E2} \cdot (SU + A_{n-1})$$

$$\overline{A_n} = \overline{E1} \cdot E2 + \overline{E1} \cdot \overline{SU} \cdot \overline{A_{n-1}}$$

The same relationship is represented in a clear manner by the following truth table:

| SU E1 E2 | $A_n$ | $\overline{A_n}$ |
|---|---|---|
| O O O | $A_{n-1}$ | $\overline{A_{n-1}}$ |
| O O L | O | L |
| O L O | L | O |
| O L L | L | O |
| L O O | L | O |
| L O L | O | L |
| L L O | L | O |
| L L L | L | O |

Figure 6:
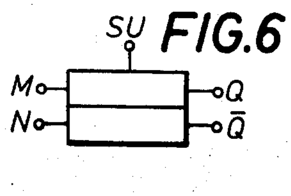
FIG. 6 is a block symbol representing one mode of utilization of the circuit of FIG. 4.

Depending on which significance is placed on the outputs at terminals A and $\overline{A}$, the resulting flipflop will be either a flipflop with a preferred setting input or a flipflop with a preferred erasing input. The former is the above-mentioned MN flipflop illustrated in FIG. 6 where E1 = M, E2 = N and A = Q, $\overline{A} = \overline{Q}$, and for which the operating equations are:

$$Q_n = M + \overline{N} \cdot (SU + Q_{n-1})$$

$$\overline{Q_n} = \overline{M} \cdot N + \overline{M} \cdot \overline{SU} \cdot \overline{Q_{n-1}}$$

Figure 7:
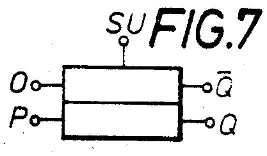
FIG. 7 is a block symbol representing a second mode of utilization of the circuit of FIG. 4.

The latter is a flipflop with a preferred erase input illustrated in FIG. 7 where E1 = O, E2 = P, $\overline{A}$ = Q and A = $\overline{Q}$, and which will be called an OP flipflop for which the operating equations are $$Q_n = \overline{O} \cdot P + \overline{O} \cdot \overline{SU} \cdot Q_{n-1}$$

$\overline{Q_n} = O = \overline{P} \cdot (SU + \overline{Q_{n-1}})$ p The present invention is not limited to the special circuit technique described with reference to FIG. 4, but can also be used for circuit modules which operate with emitter-coupled switches in a technique other than that illustrated.

It will be understood that the above description of the present invention is susceptible to various modifications, changes and adaptations, and the same are intended to be comprehended with in the meaning and range of equivalents of the appended claims.

We claim:

1. In a logic circuit composed of a first pair of transistors whose emitters are coupled together and are connected to one terminal of a current supply course, the transistors assuming respectively opposite switching states which depend on the relative levels of the control signals applied to their bases, a first pair of collector load resistors each connected to the collector of a respective transistor, at least one emitter follower stage for each transistor having its output connected to the base of its respective transistor and having an input for receiving an input signal, a direct voltage source connected to one transistor of said first pair and poled for reducing the control voltage to its transistor, and conductor means connected between the collector of the other transistor and the input of one emitter follower stage for the one transistor for applying the output of said other transistor to control the one transistor so as to store the output signal being produced by the circuit beyond the period of effectiveness of the input signals, the improvement comprising: a further pair of transistors having their emitters coupled together and connected to one terminal of a further current supply source and each having its base conductively connected to the base of a respective transistor of said first pair; and a further pair of collector load resistors each connected to the collector of a respective transistor of said further pair; said transistors of said further pair assuming respectively opposite switching states which depend on the relative levels of the signals applied to their bases, the resulting output signal of said circuit appearing at the collector of one transistor of said further pair and the complement of such output signal appearing at the collector of the other transistor of said further pair.

2. An arrangement as defined in claim 1 further comprising an additional transistor having its collector-emitter path connected in parallel with the collector-emitter path of the other transistor of said first pair, and means for selectively placing said additional transistor in a conductive state for suppressing the storage capability of said circuit.

3. An arrangement as defined in claim 2 wherein said means for placing comprise an additional emitter follower stage having its output connected to the base of said additional transistor and arranged to control said additional transistor in response to a control signal having the same amplitude level as the input signals applied to said at least one emitter follower stage for each transistor.

* * * * *